US010553530B2

(12) United States Patent
Leipold et al.

(10) Patent No.: US 10,553,530 B2
(45) Date of Patent: Feb. 4, 2020

(54) THREE-DIMENSIONAL (3D) INDUCTOR-CAPACITOR (LC) CIRCUIT

(71) Applicant: Qorvo US, Inc., Greensboro, NC (US)

(72) Inventors: Dirk Robert Walter Leipold, San Jose, CA (US); George Maxim, Saratoga, CA (US); Danny W. Chang, San Francisco, CA (US); Baker Scott, San Jose, CA (US)

(73) Assignee: Qorvo US, Inc., Greensboro, NC (US)

( * ) Notice: Subject to any disclaimer, the term of this patent is extended or adjusted under 35 U.S.C. 154(b) by 91 days.

(21) Appl. No.: 15/720,894

(22) Filed: Sep. 29, 2017

(65) Prior Publication Data
US 2019/0103316 A1    Apr. 4, 2019

(51) Int. Cl.
*H01F 27/28* (2006.01)
*H01L 23/522* (2006.01)
(52) U.S. Cl.
CPC ............... *H01L 23/5222* (2013.01)
(58) Field of Classification Search
CPC . H01F 27/28; H01L 21/8221; H01L 23/5227; H01L 21/3205; H01L 28/60; H01L 28/10; H01L 23/53209
USPC .................................................. 336/200, 232
See application file for complete search history.

(56) References Cited

U.S. PATENT DOCUMENTS

| | | | |
|---|---|---|---|
| 5,959,515 A * | 9/1999 | Cornett | H01L 28/10 257/E21.008 |
| 6,434,122 B2 | 8/2002 | Barabash et al. | |
| 6,853,286 B2 * | 2/2005 | Nikawa | G06K 19/0726 29/602.1 |
| 8,008,970 B1 | 8/2011 | Homol et al. | |
| 8,571,498 B2 | 10/2013 | Khlat | |
| 8,909,175 B1 | 12/2014 | McCallister | |
| 9,112,452 B1 | 8/2015 | Khlat | |
| 9,484,865 B2 | 11/2016 | Kobayashi et al. | |
| 2006/0244513 A1 | 11/2006 | Yen et al. | |

(Continued)

OTHER PUBLICATIONS

Non-Final Office Action for U.S. Appl. No. 15/836,334, dated Nov. 30, 2018, 5 pages.

(Continued)

*Primary Examiner* — Tszfung J Chan
(74) *Attorney, Agent, or Firm* — Withrow & Terranova, P.L.L.C.

(57) ABSTRACT

Embodiments of the disclosure relate to a three-dimensional (3D) inductor-capacitor (LC) circuit. The 3D LC circuit includes an inductor formed by a conductive ribbon of a defined height and a conductive sleeve conductively coupled to the conductive ribbon. The conductive sleeve and the conductive ribbon can generate a built-in capacitance(s) for the 3D LC circuit. In examples discussed herein, the conductive ribbon can also help reduce the skin effect of the inductor by distributing an electrical current across the defined height of the conductive ribbon. By generating the built-in capacitance(s) and distributing the electrical current across the defined height of the conductive ribbon, it is possible to reduce current crowding and improve quality factor (Q-factor) of the 3D LC circuit. As a result, it is possible to couple one or more 3D LC circuits to form a high performance radio frequency (RF) filter(s) for the fifth-generation (5G) wireless communication systems.

20 Claims, 10 Drawing Sheets

(56) References Cited

U.S. PATENT DOCUMENTS

| | | |
|---|---|---|
| 2009/0045877 A1 | 2/2009 | Wang et al. |
| 2010/0219887 A1 | 9/2010 | Ichitsubo et al. |
| 2010/0283534 A1 | 11/2010 | Pierdomenico |
| 2012/0062205 A1 | 3/2012 | Levesque et al. |
| 2012/0176196 A1 | 7/2012 | Khlat |
| 2012/0212316 A1* | 8/2012 | Cho .................. H01L 23/5225 336/84 M |
| 2012/0281597 A1 | 11/2012 | Khlat et al. |
| 2013/0043557 A1* | 2/2013 | Cho .................. H01L 23/5223 257/531 |
| 2013/0141064 A1 | 6/2013 | Kay et al. |
| 2013/0141068 A1 | 6/2013 | Kay et al. |
| 2013/0165132 A1 | 6/2013 | Goedken et al. |
| 2013/0285750 A1 | 10/2013 | Chowdhury et al. |
| 2013/0307617 A1 | 11/2013 | Khlat et al. |
| 2014/0062590 A1 | 3/2014 | Khlat et al. |
| 2014/0105327 A1 | 4/2014 | Geng et al. |
| 2015/0091653 A1 | 4/2015 | Kobayashi et al. |
| 2015/0180422 A1 | 6/2015 | Khlat et al. |
| 2015/0234402 A1 | 8/2015 | Kay et al. |
| 2015/0349724 A1 | 12/2015 | Wang et al. |
| 2016/0079165 A1* | 3/2016 | Mei ..................... H01L 23/5227 438/3 |
| 2016/0164476 A1 | 6/2016 | Wang et al. |
| 2016/0181995 A1 | 6/2016 | Nentwig et al. |
| 2017/0124013 A1 | 5/2017 | Vaillancourt et al. |

OTHER PUBLICATIONS

Ex Parte Quayle Action for U.S. Appl. No. 15/678,245, mailed Jun. 6, 2018, 4 pages.
Notice of Allowance for U.S. Appl. No. 15/825,562, dated Jun. 11, 2018, 8 pages.
Notice of Allowance for U.S. Appl. No. 15/830,686, dated May 24, 2018, 8 pages.
Notice of Allowance for U.S. Appl. No. 15/837,496, dated May 25, 2018, 8 pages.
Non-Final Office Action for U.S. Appl. No. 16/217,121, dated Oct. 24, 2019, 6 pages.

* cited by examiner

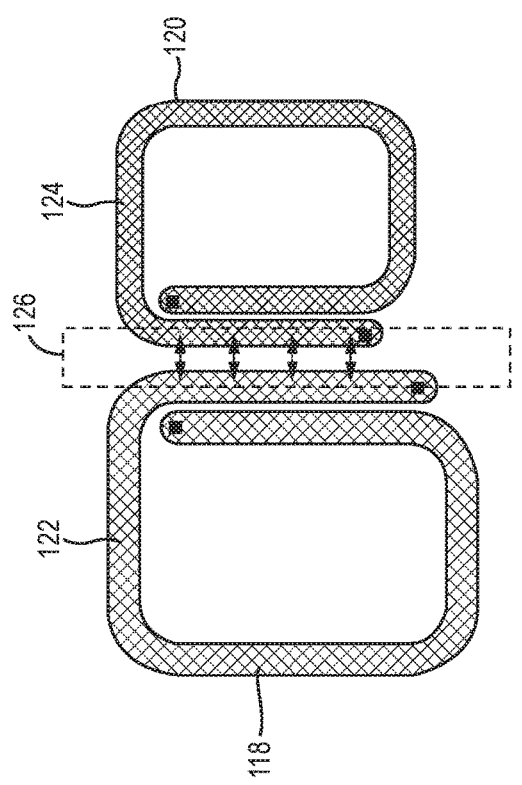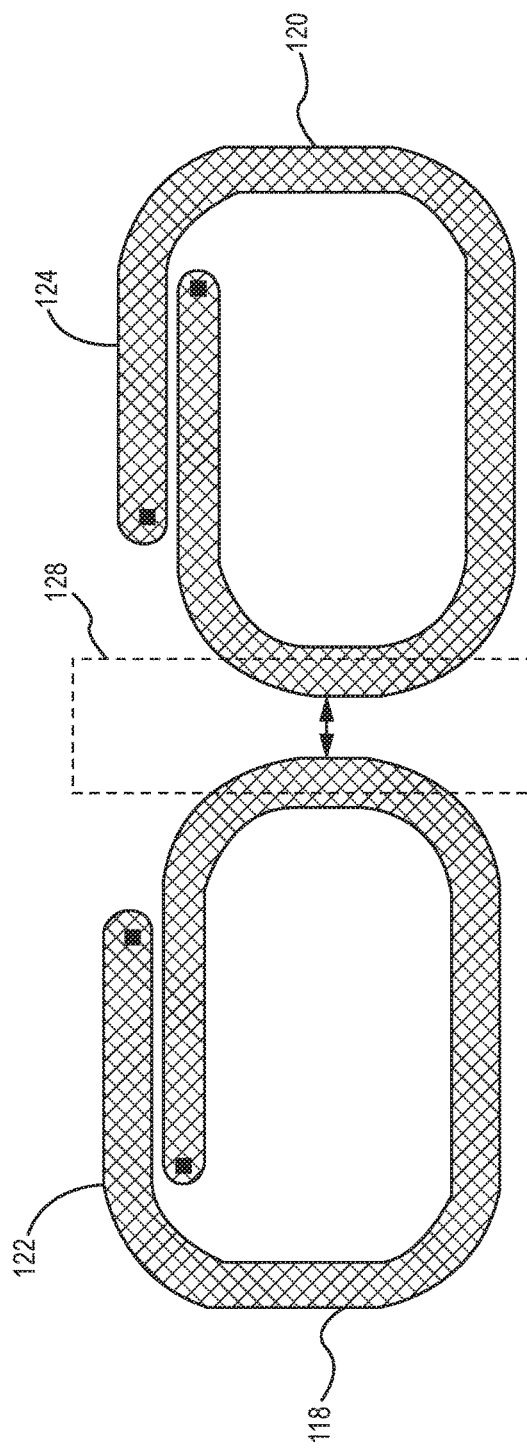

THREE-DIMENSIONAL (3D) INDUCTOR-CAPACITOR (LC) CIRCUIT

FIELD OF THE DISCLOSURE

The technology of the disclosure relates generally to an inductor-capacitor (LC) circuit.

BACKGROUND

Fifth-generation (5G) wireless communication systems have been widely regarded as the next wireless communication standard beyond the current fourth-generation (4G) communication standard such as long-term evolution (LTE). The 5G wireless communication systems are expected to provide significantly higher data rate, improved coverage range, enhanced signaling efficiency, and reduced latency compared to the 4G wireless communication systems. The 5G communication systems are designed to operate based on extremely high frequency spectrum, such as millimeter wave spectrum ranging from 30 GHz to 300 GHz.

To help provide higher spectral efficiency, the 5G wireless communication systems are configured to support wider spectrum bandwidth with relatively narrower guard band. As such, a high-performance radio frequency (RF) filter(s) is necessitated in the 5G wireless communication systems to satisfy such industry and/or regulatory requirements as occupied bandwidth, out of band emission, and spurious emission. The RF filter(s) is configured to pass RF signals within a specified spectrum bandwidth, while suppressing RF signals outside the specified spectrum bandwidth, based on an oscillation (resonance) frequency generated by an internal or an external inductor-capacitor (LC) circuit. In this regard, the efficiency and quality of the RF filter(s) largely depends on accuracy of the oscillation frequency generated by the LC circuit. The accuracy of the oscillation frequency is often measured by a quality factor (Q-factor) of the LC circuit.

As the name suggests, the LC circuit typically includes an inductor(s) and a capacitor(s). The most common type of inductor(s) employed in a conventional LC circuit is a planar inductor(s). Given that the planar inductor(s) typically corresponds to a relatively low Q-factor, performance of the RF filter(s) may be degraded as a result. As such, it may be desired to improve the Q-factor of the conventional LC circuit(s) to enable a higher efficiency RF filter(s) for achieving desired spectral efficiency in the 5G wireless communication systems.

SUMMARY

Embodiments of the disclosure relate to a three-dimensional (3D) inductor-capacitor (LC) circuit. The 3D LC circuit includes an inductor formed by a conductive ribbon of a defined height and a conductive sleeve conductively coupled to the conductive ribbon. Collectively, the conductive sleeve and the conductive ribbon can generate a built-in capacitance(s) for the 3D LC circuit, thus eliminating the need for including a capacitor(s) in the 3D LC circuit. In examples discussed herein, the conductive ribbon can also help reduce a skin effect of the inductor by distributing an electrical current across the defined height of the conductive ribbon. By generating the built-in capacitance(s) and distributing the electrical current across the defined height of the conductive ribbon, it is possible to reduce current crowding and improve the quality factor (Q-factor) of the 3D LC circuit. As a result, it is possible to couple one or more 3D LC circuits to form a high performance radio frequency (RF) filter(s) for the fifth-generation (5G) wireless communication systems.

In one aspect, a 3D LC circuit is provided. The 3D LC circuit includes a substrate having a top surface and a bottom surface. The 3D LC circuit also includes an inductor formed by a conductive ribbon and comprising an inner electrode portion, an outer electrode portion, and a winding portion extending between the inner electrode portion and the outer electrode portion. The conductive ribbon includes opposing sidewalls having a defined height that equals at least twice a thickness of the conductive ribbon and is provided in the substrate with the opposing sidewalls being perpendicular to the top surface and the bottom surface of the substrate. The 3D LC circuit also includes a conductive sleeve. The conductive sleeve includes a conductive sidewall disposed along the outer electrode portion. The outer electrode portion is between the conductive sidewall and the inner electrode portion. The conductive sleeve also includes a conductive top plate disposed above at least a portion of the conductive ribbon and conductively coupled to the inner electrode portion and the conductive sidewall. The conductive sleeve also includes a conductive bottom plate disposed below at least a portion of the conductive ribbon and conductively coupled to the inner electrode portion and the conductive sidewall. The conductive sleeve and the conductive ribbon are configured to generate at least one capacitance.

In another aspect, a method for improving a Q-factor of a 3D LC circuit is provided. The method includes forming an inductor by a conductive ribbon. The inductor comprises an inner electrode portion, an outer electrode portion, and a winding portion extending between the inner electrode portion and the outer electrode portion. The conductive ribbon comprises opposing sidewalls having a defined height that equals at least twice a thickness of the conductive ribbon and is provided in a substrate with the opposing sidewalls being perpendicular to a top surface and a bottom surface of the substrate. The method also includes providing a conductive sleeve. The method also includes disposing a conductive sidewall along the outer electrode portion. The outer electrode portion is between the conductive sidewall and the inner electrode portion. The method also includes disposing a conductive top plate above at least a portion of the conductive ribbon and conductively coupled to the inner electrode portion and the conductive sidewall. The method also includes disposing a conductive bottom plate disposed below at least a portion of the conductive ribbon and conductively coupled to the inner electrode portion and the conductive sidewall. The method also includes generating at least one capacitance by the conductive sleeve and the conductive ribbon.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure and, together with the description, serve to explain the principles of the disclosure.

FIGS. 6A-6B provide exemplary illustrations of magnetic couplings between a pair of inductors disposed in close proximity.

DETAILED DESCRIPTION

Figure 1A:
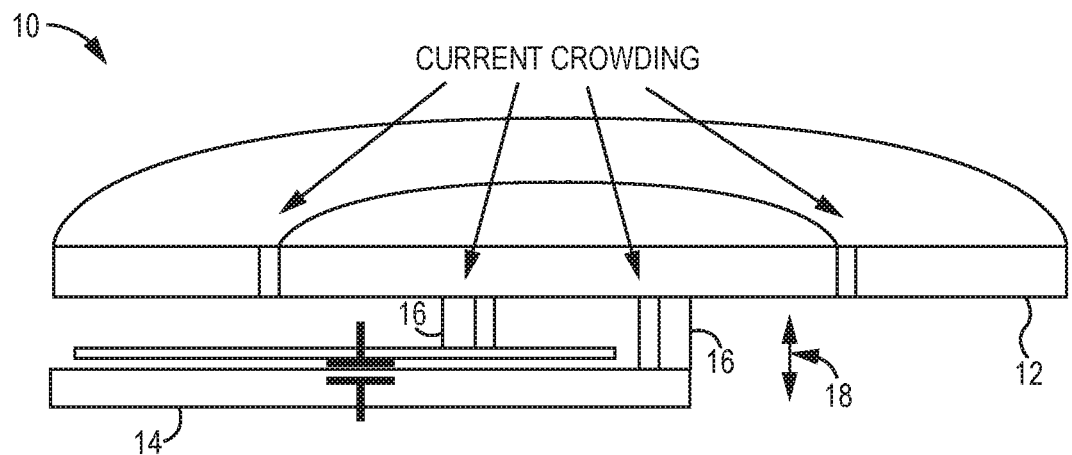
FIG. 1A is a schematic diagram of an exemplary conventional inductor-capacitor (LC) circuit having a degraded quality factor (Q-factor) due to current crowding in thin vertical layers.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a three-dimensional (3D) inductor-capacitor (LC) circuit. The 3D LC circuit includes an inductor formed by a conductive ribbon of a defined height and a conductive sleeve conductively coupled to the conductive ribbon. Collectively, the conductive sleeve and the conductive ribbon can generate a built-in capacitance(s) for the 3D LC circuit, thus eliminating the need for including a capacitor(s) in the 3D LC circuit. In examples discussed herein, the conductive ribbon can also help reduce a skin effect of the inductor by distributing an electrical current across the defined height of the conductive ribbon. By generating the built-in capacitance(s) and distributing the electrical current across the defined height of the conductive ribbon, it is possible to reduce current crowding and improve the quality factor (Q-factor) of the 3D LC circuit. As a result, it is possible to couple one or more 3D LC circuits to form a high performance radio frequency (RF) filter(s) for the fifth-generation (5G) wireless communication systems.

Figure 1B:
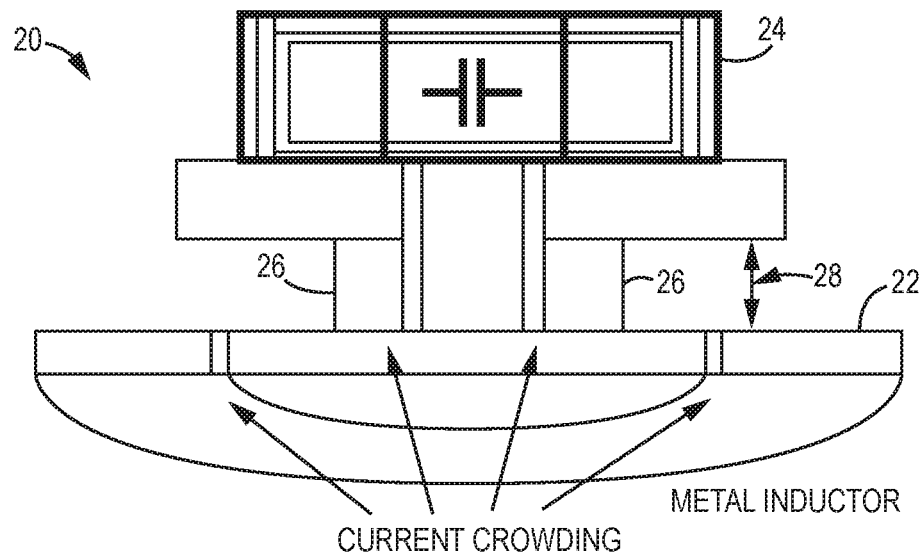
FIG. 1B is a schematic diagram of another exemplary conventional LC circuit having a degraded Q-factor due to current crowding in vertical interconnects.

Before discussing exemplary aspects of a 3D LC circuit, a brief overview of a conventional LC circuit having a low Q-factor is first provided with reference to FIGS. 1A and 1B. The discussion of specific exemplary aspects of a 3D starts below with reference to FIG. 2A.

In a non-limiting example, an LC circuit is a type of oscillator including an inductor(s) and a capacitor(s), which provide required positive feedback for sustaining oscillations at a determined frequency(ies). In this regard, the LC circuit can also be referred to as an LC resonant circuit, an LC tank circuit, or an LC tuned circuit. In many electronic devices (e.g., smartphones), the LC circuit is often used to form various types of RF filters (e.g., low pass filters, high pass filters, band pass filters, and band reject filters) for providing frequency matching and/or frequency selectivity in the electronic devices.

One commonly used performance indicator of the LC circuit is the so-called Q-factor, which relates the maximum or peak energy stored in the LC circuit (the reactance) to the energy dissipated (the resistance) during each cycle of oscillation. The Q-factor of the LC circuit can be determined according to the equation (Eq. 1) below.

$$Q = \frac{\omega * L}{R} \qquad \text{(Eq. 1)}$$

In the equation (Eq. 1) above, Q represents the Q-factor of the LC circuit, L represents inductance of the inductor(s) in the LC circuit, R represents resistance in the LC circuit, and w represents angular frequency of the LC circuit. In this regard, the resistance (R) can adversely affect the Q-factor of the LC circuit.

FIG. 1A is a schematic diagram of an exemplary conventional LC circuit 10 having a degraded Q-factor due to current crowding in thin vertical layers. The conventional LC circuit 10 includes a metal inductor 12 and a metal-insulator-metal (MIM) capacitor 14. As shown in FIG. 1A, the MIM capacitor 14 is vertically coupled to the metal inductor 12 via one or more conductive structures 16. When the conventional LC circuit 10 is functioning, the metal inductor 12 and the MIM capacitor 14 induce an electrical current 18 that flows back and forth between the metal inductor 12 and the MIM capacitor 14 via the conductive structures 16. The conductive structures 16 may be formed by conductive traces that can only convey a limited amount of electrical current in a particular duration. In this regard, the conductive structures 16 become a bottleneck to cause current crowding in the conventional LC circuit 10. As a result of the current crowding, the resistance (R) of the conventional LC circuit 10 would increase, thus resulting in a decreased Q-factor according to the equation (Eq. 1) above.

FIG. 1B is a schematic diagram of another exemplary conventional LC circuit 20 having a degraded Q-factor due to current crowding in vertical interconnects. The conventional LC circuit 20 includes a metal inductor 22 and a surface-mount-device (SMD) capacitor 24. As shown in FIG. 1B, the SMD capacitor 24 is vertically coupled to the metal inductor 22 via one or more conductive interconnects 26. When the conventional LC circuit 20 is functioning, the metal inductor 22 and the SMD capacitor 24 induce an electrical current 28 that flows back and forth between the metal inductor 22 and the SMD capacitor 24 via the conductive interconnects 26. The conductive interconnects 26 may only be able to convey a limited amount of electrical current in a particular duration. In this regard, the conductive interconnects 26 become a bottleneck to cause current crowding in the conventional LC circuit 20. As a result of the current crowding, the resistance (R) of the conventional LC circuit 20 would increase, thus resulting in a decreased Q-factor according to the equation (Eq. 1) above.

As such, it may be desired to improve the Q-factor in the conventional LC circuit 10 of FIG. 1A and the conventional LC circuit 20 of FIG. 1B by avoiding the current crowding in the conductive structures 16 and the conductive interconnects 26. As discussed below, a 3D LC circuit can provide an improved Q-factor compared to the conventional LC circuit 10 and the conventional LC circuit 20. In one aspect, the 3D LC circuit includes an inductor formed by a conductive band of a defined height. The electrical current induced in the 3D LC circuit is distributed across the entire defined height of the conductive ribbon to help reduce potential current crowding. In another aspect, the 3D LC circuit utilizes a conductive sleeve to collectively form a built-in capacitance(s) with the conductive ribbon, thus helping to eliminate the conductive structures 16 of FIG. 1A and the conductive interconnects 26 of FIG. 1B. By generating the built-in capacitance(s) and distributing the electrical current across the defined height of the conductive ribbon, it is possible to provide a high Q-factor in the 3D LC circuit. As a result, it is possible to couple one or more of the 3D LC circuits to form high performance RF filter(s) in the fifth-generation (5G) wireless communication systems. In exemplary aspects discussed herein, the high Q-factor refers to a Q-factor greater than three hundred.

Figure 2A:
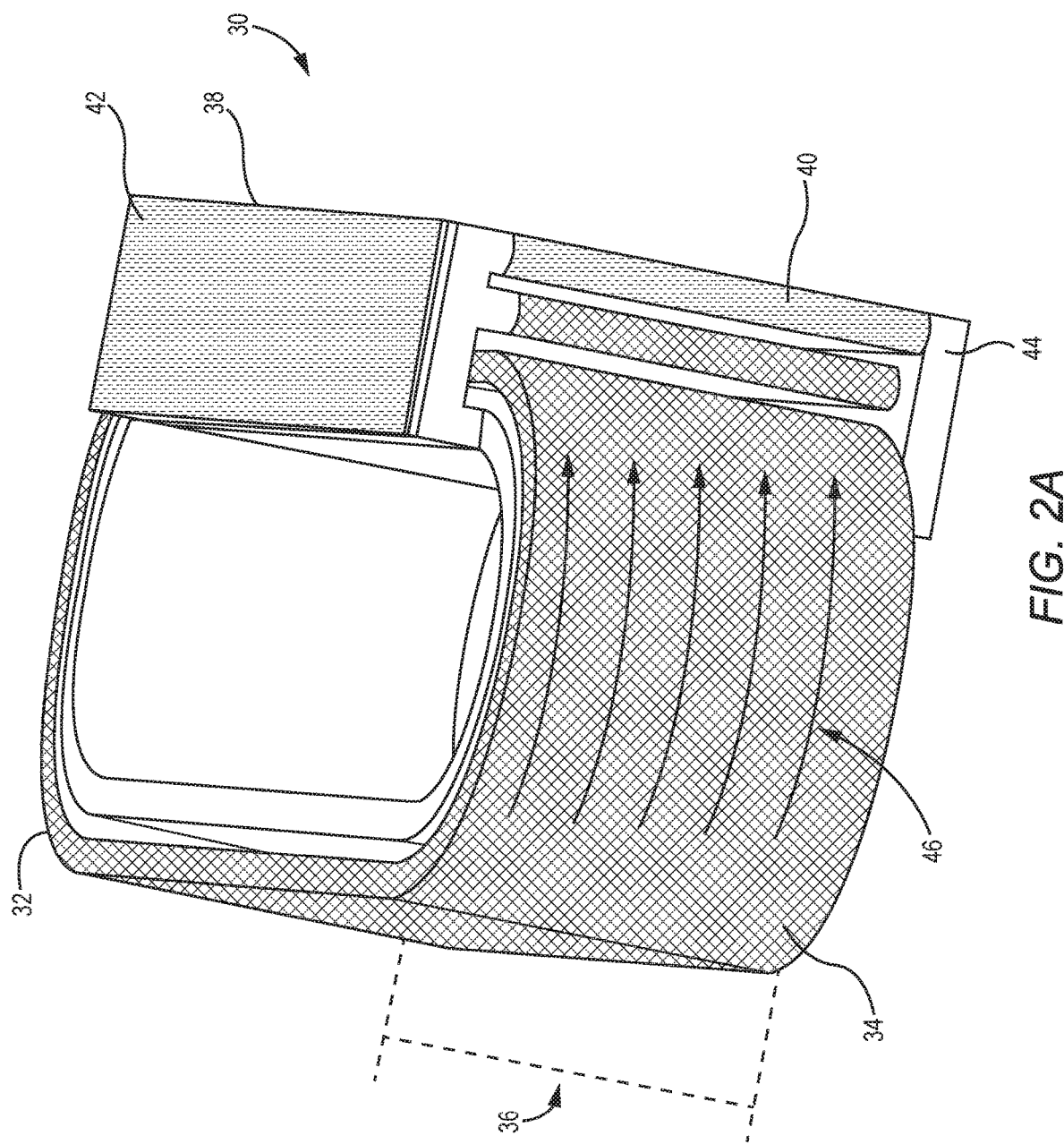
FIG. 2A is a schematic diagram of an exemplary three-dimensional (3D) LC circuit configured to provide a higher Q-factor than the conventional LC circuit of FIG. 1A and the conventional LC circuit of FIG. 1B.

FIG. 2A is a schematic diagram of an exemplary 3D LC circuit 30 configured to provide a higher Q-factor than the conventional LC circuit 10 of FIG. 1A and the conventional LC circuit 20 of FIG. 1B. The 3D LC circuit 30 includes an inductor 32 formed by a conductive ribbon 34 of a defined height 36. In a non-limiting example, the conductive ribbon 34 can be made using a conductive metal such as copper. In another non-limiting example, the defined height 36 is at least two hundred micrometers (200 µm). The conductive ribbon 34 is conductively coupled to a conductive sleeve 38 formed with a conductive sidewall 40, a conductive top plate 42, and a conductive bottom plate 44. The 3D LC circuit 30 is configured to distribute an induced electrical current 46 across the defined height 36 of the conductive ribbon 34. As such, it is possible to reduce the skin effect and resistance (R) of the inductor 32 to help improve the Q-factor of the 3D LC circuit 30. In a non-limiting example, it is possible to adjust the Q-factor of the 3D LC circuit 30 by increasing or decreasing the defined height 36 of the conductive ribbon 34.

Figure 2B:
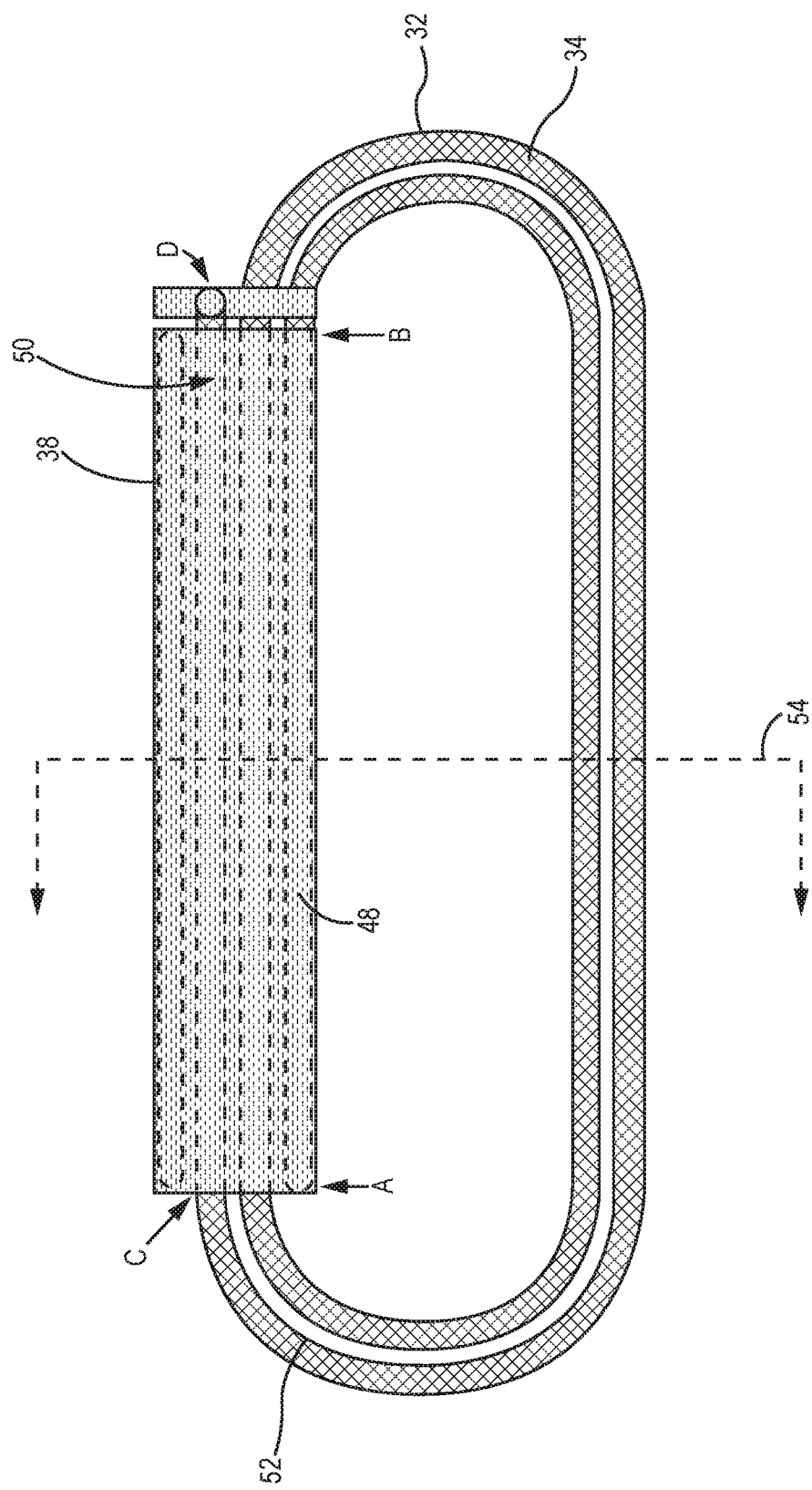
FIG. 2B is a schematic diagram providing an exemplary top view of the 3D LC circuit of FIG. 2A.

FIG. 2B is a schematic diagram providing an exemplary top view of the 3D LC circuit 30 of FIG. 2A. Common elements between FIGS. 2A and 2B are shown therein with common element numbers and will not be re-described herein. The conductive ribbon 34 that forms the inductor 32 includes an inner electrode portion 48 (between points A and B), an outer electrode portion 50 (between points C and D), and a winding portion 52 (between points B and C).

Figure 2C:
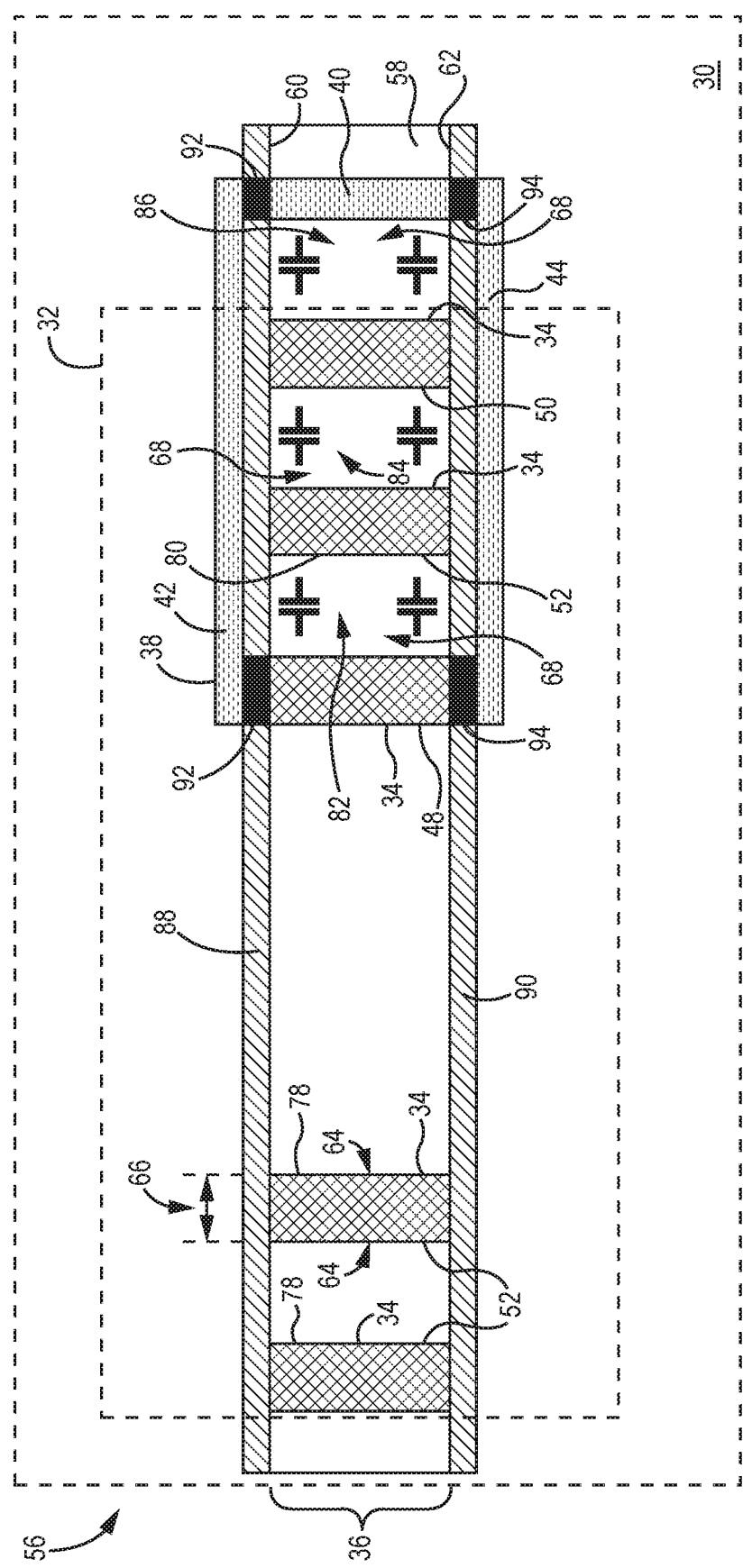
FIG. 2C is a schematic diagram providing an exemplary cross-section view of the 3D LC circuit of FIGS. 2A and 2B.

To help further illustrate the inner construction of the 3D LC circuit 30, a cross-section view is made along a line 54 and will be discussed next in FIG. 2C. In this regard, FIG. 2C is a schematic diagram providing an exemplary cross-section view 56 of the 3D LC circuit 30 of FIGS. 2A and 2B. Common elements between FIGS. 2A, 2B, and 2C are shown therein with common element numbers and will not be re-described herein.

The 3D LC circuit 30 includes a substrate 58 having a top surface 60 and a bottom surface 62. In a non-limiting example, the substrate 58 can be realized based on various laminates (e.g., glass, Rogers, FR4, etc.) or on-chip using thick metal involved in some semiconductor fabrication processes. The conductive ribbon 34, which forms the inductor 32, is provided in the substrate 58 between the top surface 60 and the bottom surface 62. The conductive ribbon 34 includes opposing sidewalls 64 defining a thickness 66 of the conductive ribbon 34. In a non-limiting example, the thickness 66 is less than one-half (½) of the defined height 36 of the conductive ribbon 34. The conductive ribbon 34 is disposed in the substrate 58 with the opposing sidewalls 64 being perpendicular to the top surface 60 and the bottom surface 62 of the substrate 58.

The conductive sidewall 40 of the conductive sleeve 38 is disposed in parallel along the outer electrode portion 50 of the conductive ribbon 34. More specifically, the conductive sidewall 40 is disposed in such a way that causes the outer electrode portion 50 to be located between the conductive sidewall 40 and the inner electrode portion 48.

The conductive top plate 42 of the conductive sleeve 38 is disposed above the conductive ribbon 34. The conductive top plate 42 is conductively coupled to the inner electrode portion 48 of the conductive ribbon 34 and the conductive sidewall 40 of the conductive sleeve 38, while being isolated to the outer electrode portion 50 of the conductive ribbon 34. Likewise, the conductive bottom plate 44 of the conductive sleeve 38 is disposed below the conductive ribbon 34. The conductive bottom plate 44 is conductively coupled to the inner electrode portion 48 of the conductive ribbon 34 and the conductive sidewall 40 of the conductive sleeve 38, while being isolated from the outer electrode portion 50 of the conductive ribbon 34. Collectively, the conductive sleeve 38 and the conductive ribbon 34 generate at least one capacitance 68. In a non-limiting example, it is possible to adjust the capacitance 68 by increasing or decreasing a length of the conductive ribbon 34.

Figure 3:
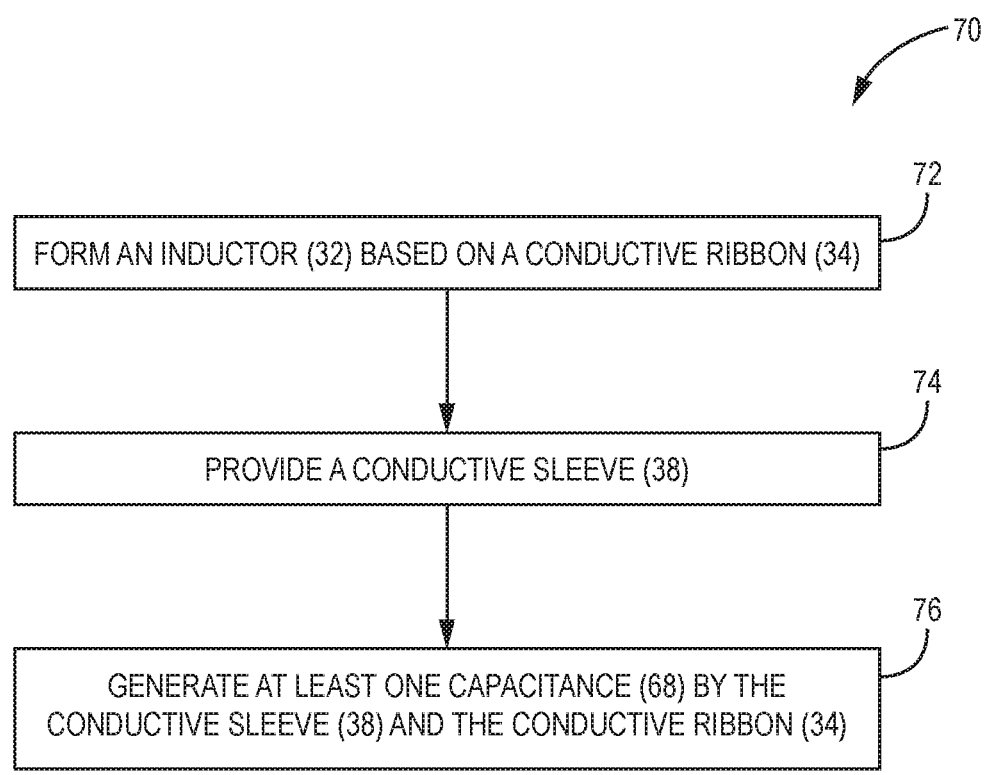
FIG. 3 is a flowchart of an exemplary process for improving the Q-factor in the 3D LC circuit of FIGS. 2A-2C.

The 3D LC circuit 30 can be configured to improve the Q-factor according to a process. In this regard, FIG. 3 is a flowchart of an exemplary process 70 for improving the Q-factor in the 3D LC circuit 30 of FIGS. 2A-2C.

According to the process 70, the inductor 32 is formed based on the conductive ribbon 34 (block 72). As stated above, the inductor 32 includes the inner electrode portion 48, the outer electrode portion 50, and the winding portion 52. Further, the conductive ribbon 34 that forms the inductor 32 has the thickness 66 between the opposing sidewalls 64 being less than ½ of the defined height 36 of the conductive ribbon 34, and the conductive ribbon 34 is provided in the substrate 58 with the opposing sidewalls 64 being perpendicular to the top surface 60 and the bottom surface 62 of the substrate 58. The conductive sleeve 38 is then provided (block 74). As discussed above, the conductive sleeve 38 includes the conductive sidewall 40 disposed along the outer electrode portion 50 causing the outer electrode portion 50 to be located between the conductive sidewall 40 and the inner electrode portion 48. The conductive sleeve 38 also includes the conductive top plate 42 and the conductive bottom plate 44. As discussed above, the conductive top plate 42 is disposed above the conductive ribbon 34 and conductively coupled to the inner electrode portion 48 and the conductive sidewall 40. The conductive bottom plate 44 is disposed below the conductive ribbon 34 and conductively coupled to the inner electrode portion 48 and the conductive sidewall 40. Accordingly, the conductive sleeve 38 and the conductive ribbon 34 can collectively generate the capacitance 68 in the 3D LC circuit 30 (block 76).

With reference back to FIG. 2C, in a non-limiting example, the inner electrode portion 48 and the outer electrode portion 50 are both linear. Accordingly, the conductive sidewall 40 would be a linear sidewall disposed along the linear outer electrode portion.

The winding portion 52 includes at least one outer section 78 disposed along the inner electrode portion 48 causing the inner electrode portion 48 to be located between the outer section 78 of the winding portion 52 and the outer electrode portion 50 of the conductive ribbon 34. The winding portion 52 may also include at least one inner section 80 disposed between the inner electrode portion 48 and the outer electrode portion 50 of the conductive ribbon 34. In this regard, the conductive sleeve 38 and the conductive ribbon 34 can generate at least one first capacitance 82 between the inner electrode portion 48 and the inner section 80, at least one second capacitance 84 between the inner section 80 and the outer electrode portion 50, and at least one third capacitance 86 between the outer electrode portion 50 and the conductive sidewall 40.

The 3D LC circuit 30 includes a top insulation layer 88 and a bottom insulation layer 90. The top insulation layer 88 is disposed between the top surface 60 of the substrate 58 and the conductive top plate 42 of the conductive sleeve 38 to insulate the conductive top plate 42 from the outer electrode portion 50 and the inner section 80 of the winding portion 52. The top insulation layer 88 includes one or more top conductive vias 92 to conductively couple the conductive top plate 42 to the inner electrode portion 48 and the conductive sidewall 40. The bottom insulation layer 90 is disposed between the bottom surface 62 of the substrate 58 and the conductive bottom plate 44 of the conductive sleeve 38 to insulate the conductive bottom plate 44 from the outer electrode portion 50 and the inner section 80 of the winding portion 52. The bottom insulation layer 90 includes one or more bottom conductive vias 94 to conductively couple the conductive bottom plate 44 to the inner electrode portion 48 and the conductive sidewall 40.

Although the conductive ribbon 34 as shown in FIGS. 2A and 2B is in an oval-shape, it should be appreciated that the conductive ribbon 34 can be in various different shapes, as illustrated and discussed next with references to FIGS. 4A-4D. In this regard, FIGS. 4A-4D are schematic diagrams providing exemplary illustrations of various shapes and configurations of conductive ribbon that can be provided as the conductive ribbon 34 in the 3D LC circuit 30 of FIGS. 2A-2C. Common elements between FIGS. 2A-2C and 4A-4D are shown therein with common element numbers and will not be re-described herein.

Figure 4A:
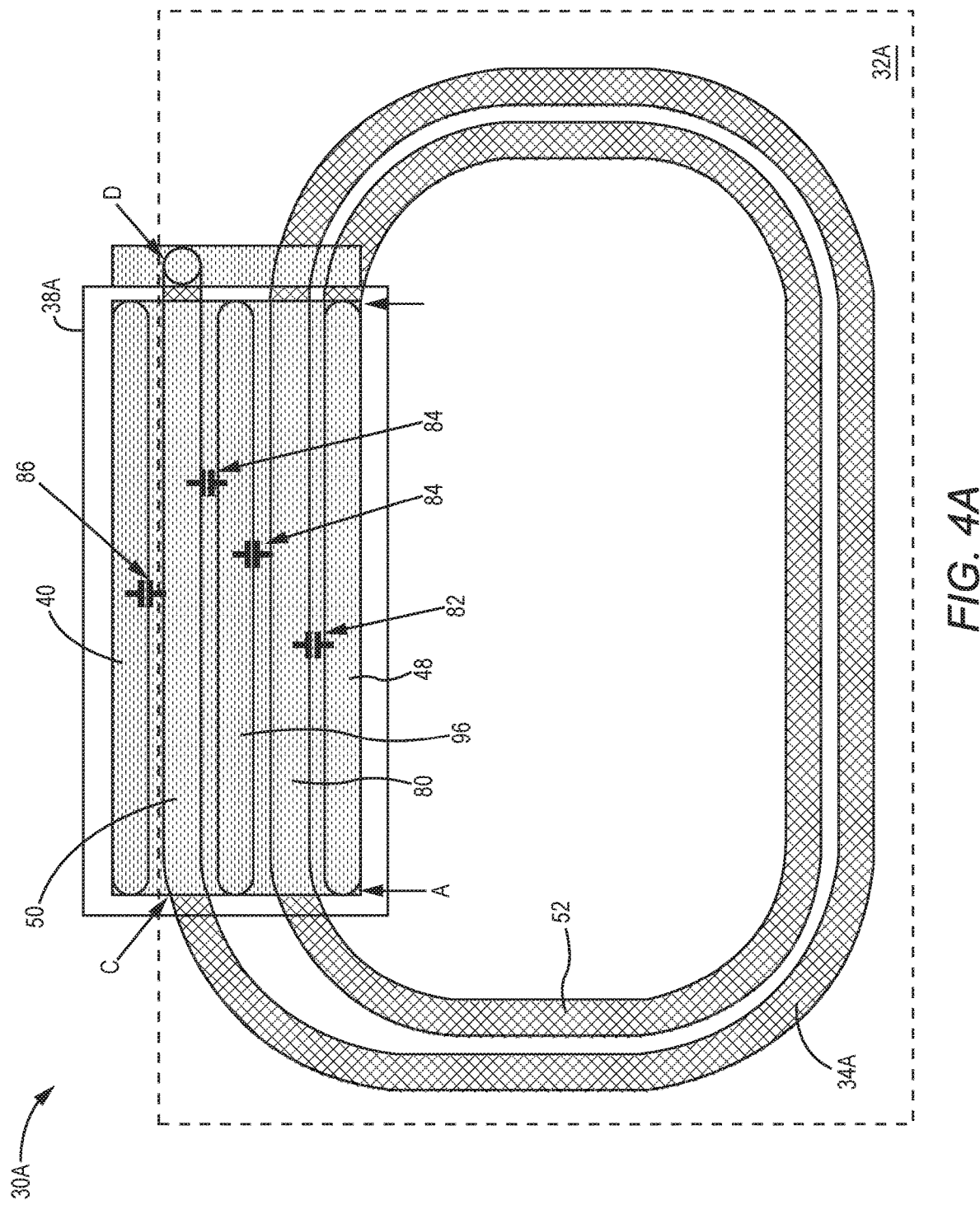
FIGS. 4A-4D are schematic diagrams providing exemplary illustrations of various shapes and configurations of a conductive ribbon that can be provided as the conductive ribbon in the 3D LC circuit of FIGS. 2A-2C.

FIG. 4A shows an exemplary top view of a 3D LC circuit 30a. The 3D LC circuit 30a includes a conductive ribbon 34a, which forms an inductor 32a, and a conductive sleeve 38a. The conductive ribbon 34a includes the inner electrode portion 48, the outer electrode portion 50, and the winding portion 52 as previously described in FIGS. 2B-2C. The winding portion 52 includes the inner section 80, disposed between the inner electrode portion 48 and the outer electrode portion 50. The conductive sleeve 38a includes a second conductive sidewall 96, in addition to the conductive sidewall 40. The second conductive sidewall 96 is disposed between the inner section 80 and the outer electrode portion 50. In this regard, the conductive sleeve 38a and the conductive ribbon 34a can generate the first capacitance 82 between the inner electrode portion 48 and the inner section 80, the second capacitance 84 between the inner section 80 and the second conductive sidewall 96 and between the second conductive sidewall 96 and the outer electrode portion 50, and the third capacitance 86 between outer electrode portion 50 and the conductive sidewall 40.

Figure 4B:
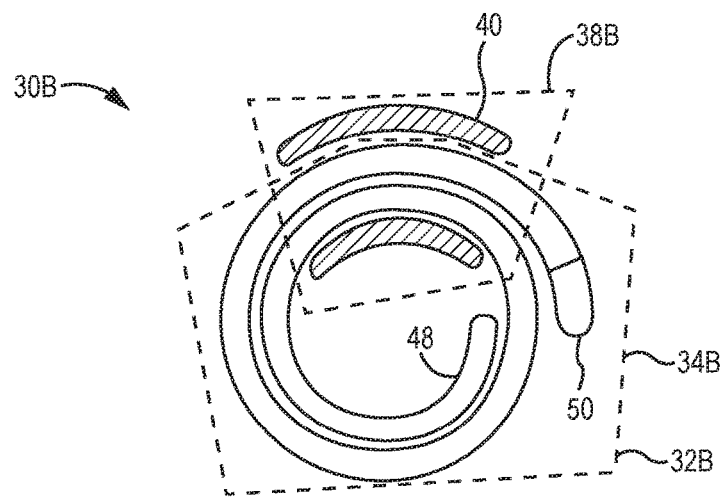

FIG. 4B shows an exemplary top view of a 3D LC circuit 30b. The 3D LC circuit 30b includes a conductive ribbon 34b, which forms an inductor 32b, and a conductive sleeve 38b. As shown in FIG. 4B, the inner electrode portion 48 and the outer electrode portion 50 are both curved electrode portions. Accordingly, the conductive sidewall 40 is a curved sidewall disposed along the curved outer electrode portion 50.

Figure 4C:
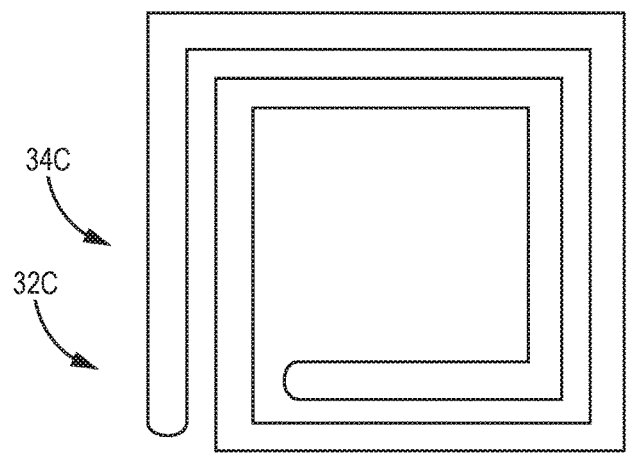
Figure 4D:
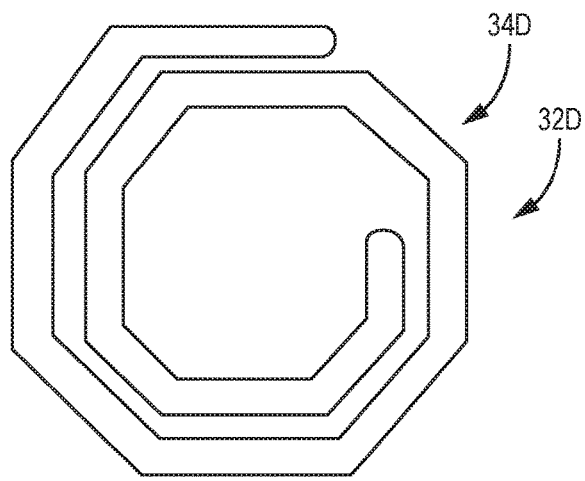

FIG. 4C shows an exemplary top view of an inductor 32c formed by a conductive ribbon 34c disposed in a rightangled shape. FIG. 4D shows an exemplary top view of an inductor 32d formed by a conductive ribbon 34d disposed in an octagonal shape.

Figure 5A:
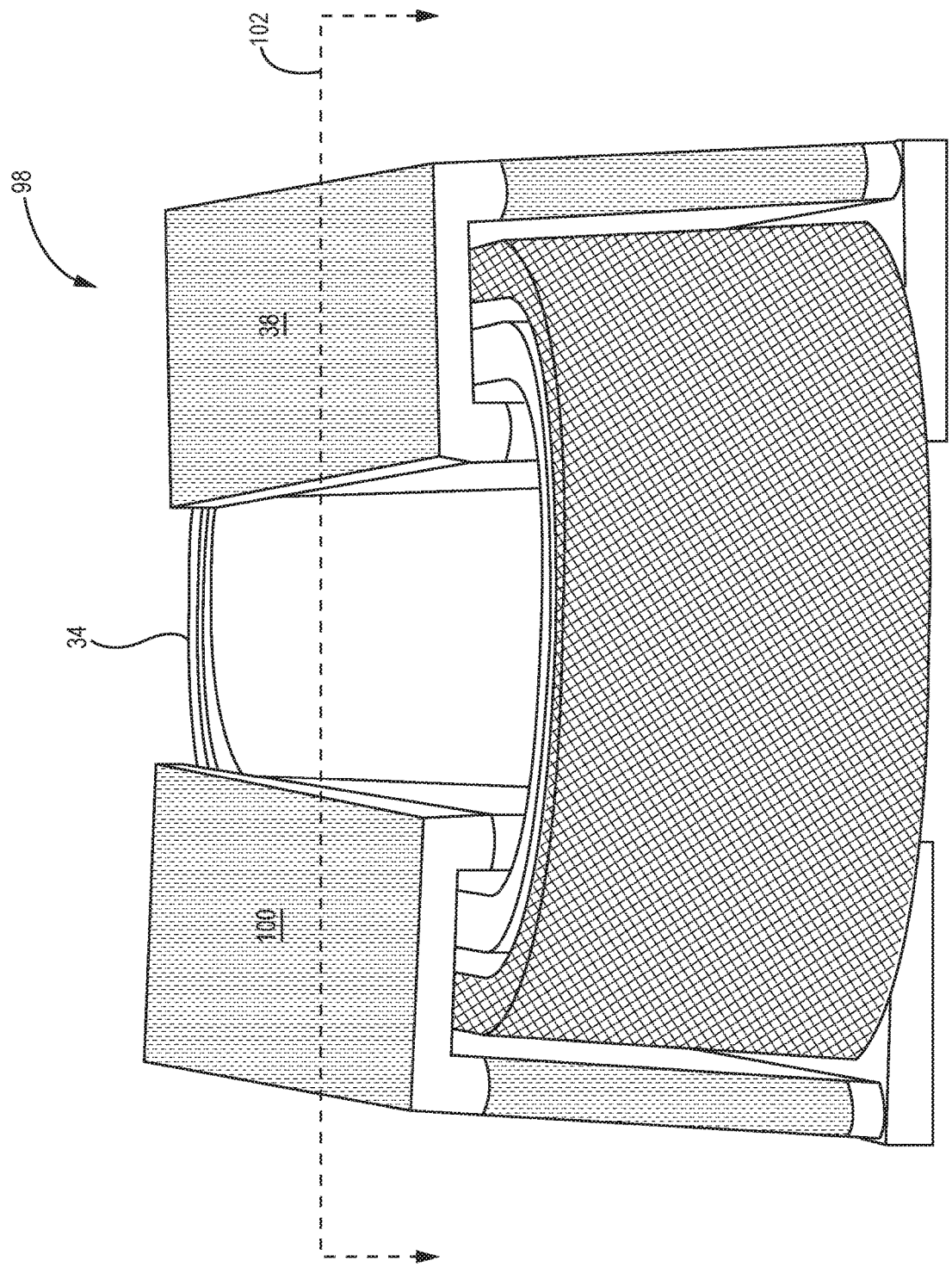
FIG. 5A is a schematic diagram of an exemplary 3D LC circuit including a second conductive sleeve in addition to a first conductive sleeve and a conductive ribbon included in the 3D LC circuit of FIGS. 2A-2C.

As previous discussed in FIG. 2C, the winding portion 52 includes at least one outer section 78 disposed along the inner electrode portion 48 causing the inner electrode portion 48 to be located between the outer section 78 of the winding portion 52 and the outer electrode portion 50 of the conductive ribbon 34. In this regard, it may be possible to add a second conductive sleeve to the 3D LC circuit 30 of FIGS. 2A-2C to form a 3D LC circuit with two conductive sleeves. In this regard, FIG. 5A is a schematic diagram of an exemplary 3D LC circuit 98 including a second conductive sleeve 100 in addition to the conductive sleeve 38 and the conductive ribbon 34 of FIGS. 2A-2C. To help further illustrate the inner structure of the 3D LC circuit 98, a cross-section view of the 3D LC circuit 98 is produced along line 102 and discussed next.

Figure 5B:
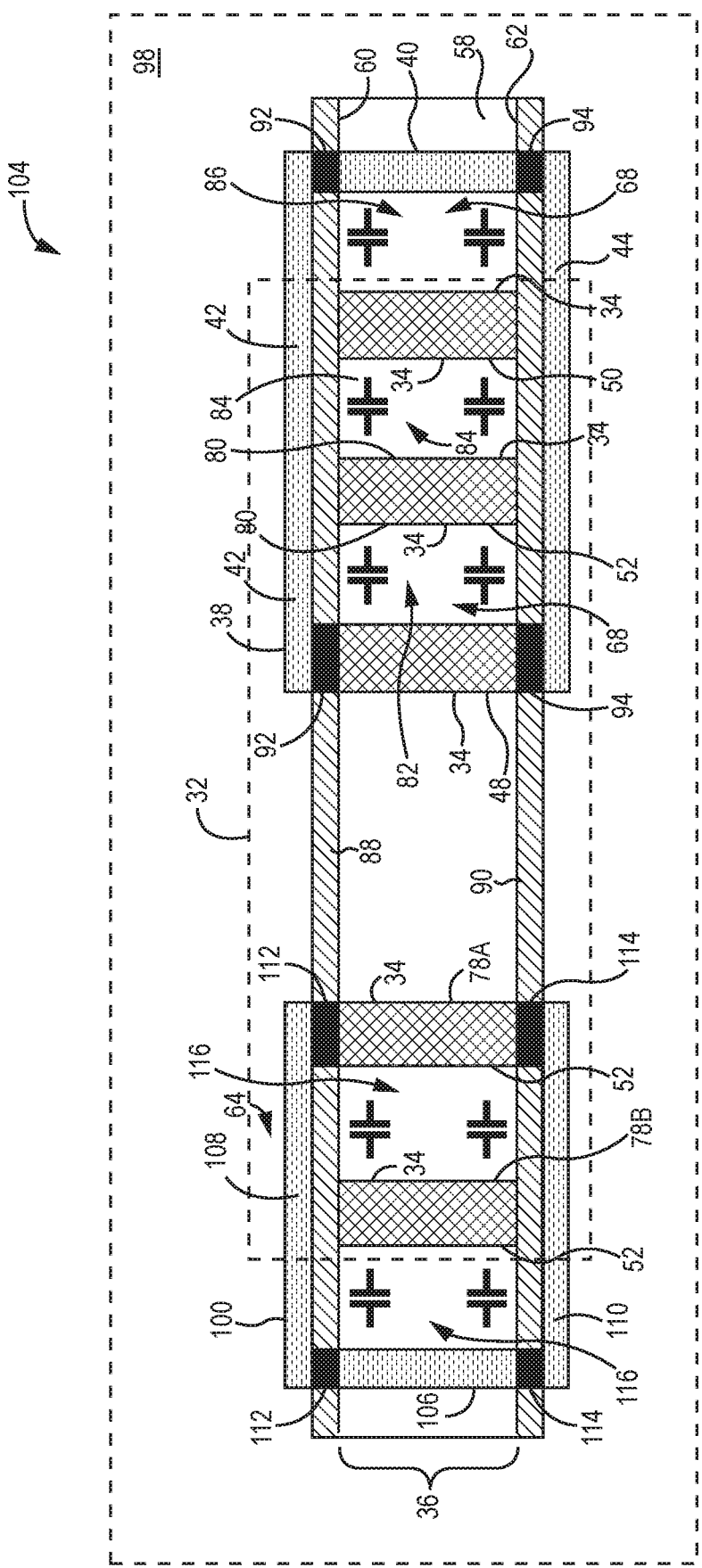
FIG. 5B is a schematic diagram providing an exemplary cross-section view of the 3D LC circuit of FIG. 5A.

In this regard, FIG. 5B is a schematic diagram providing an exemplary cross-section view 104 of the 3D LC circuit 98 of FIG. 5A. Common elements between FIGS. 2A-2C and 5A-5B are shown therein with common element numbers and will not be re-described herein.

The second conductive sleeve 100 includes a second conductive sidewall 106, a second conductive top plate 108, and a second conductive bottom plate 110. As shown in FIG. 5B, the winding portion 52 includes a first outer section 78a and a second outer section 78b. In this regard, the second conductive sidewall 106 is disposed along the second outer section 78b, which is farther away from the inner electrode portion 48. Accordingly, the first outer section 78a and the second outer section 78b are both sandwiched between the second conductive sidewall 106 and the inner electrode portion 48.

The second conductive top plate 108 is disposed above the conductive ribbon 34. The second conductive top plate 108 is conductively coupled to the second conductive sidewall 106 and the first outer section 78a via one or more second top vias 112, while being isolated from the second outer section 78b by the top insulation layer 88. Similarly, the second conductive bottom plate 110 is disposed below the conductive ribbon 34. The second conductive bottom plate 110 is conductively coupled to the second conductive sidewall 106 and the first outer section 78a via one or more second bottom vias 114, while being isolated from the second outer section 78b by the bottom insulation layer 90. The second conductive sleeve 100 and the conductive ribbon 34 can generate additional capacitance 116 between the second conductive sidewall 106, the second outer section 78b, and the first outer section 78a.

Notably, the first outer section 78a and the second outer section 78b can both be linear outer sections. Accordingly, the second conductive sidewall 106 would be a second linear conductive sidewall disposed along the second outer section 78b. In contrast, the first outer section 78a and the second outer section 78b can both be curved outer sections. Accordingly, the second conductive sidewall 106 would be a second curved conductive sidewall disposed along the second outer section 78b.

In a non-limiting example, the inductor 32 of FIG. 2C can be magnetically coupled to another inductor disposed in close proximity. In this regard, FIGS. 6A-6B provide exemplary illustrations of magnetic couplings between a pair of inductors disposed in close proximity.

In FIG. 6A, a first inductor 118 is magnetically coupled to a second inductor 120 disposed in proximity to the first inductor 118. The first inductor 118 and the second inductor 120 are formed by a first conductive ribbon 122 and a second conductive ribbon 124, respectively. As shown in FIG. 6A, the first inductor 118 and the second inductor 120 are magnetically coupled along a longer linear section 126 of the first conductive ribbon 122 and the second conductive ribbon 124, thus resulting in a higher coupling coefficient. In contrast, in FIG. 6B, the first inductor 118 and the second inductor 120 are magnetically coupled along a shorter curved section 128 of the first conductive ribbon 122 and the second conductive ribbon 124, thus resulting in a lower coupling coefficient.

By using the coupling configurations shown in FIGS. 6A-6B, it is possible to include more than one of the 3D LC circuits 30 to form more complex RF filters. Simulations and experiments have shown that the 3D LC circuit 30 of FIGS. 2A-2C is able to provide a high Q-factor in the several hundreds in RF frequency ranging from few to multiple GHz. As such, the 3D LC circuit 30 is well suited for building wideband filters for 5G wireless communication systems that have more stringent out-of-band rejection constrains.

Those skilled in the art will recognize improvements and modifications to the preferred embodiments of the present disclosure. All such improvements and modifications are considered within the scope of the concepts disclosed herein and the claims that follow.

What is claimed is:

1. A three-dimensional (3D) inductor-capacitor (LC) circuit comprising:
    a substrate having a top surface and a bottom surface;
    an inductor formed by a conductive ribbon and comprising an inner electrode portion, an outer electrode portion, and a winding portion extending between the inner electrode portion and the outer electrode portion, wherein the conductive ribbon comprises opposing sidewalls having a defined height that equals at least twice a thickness of the conductive ribbon and is provided in the substrate with the opposing sidewalls being perpendicular to the top surface and the bottom surface of the substrate; and
    a conductive sleeve comprising:
        a conductive sidewall disposed along the outer electrode portion, wherein the outer electrode portion is between the conductive sidewall and the inner electrode portion;
        a conductive top plate disposed above at least a portion of the conductive ribbon and conductively coupled to the inner electrode portion and the conductive sidewall; and
        a conductive bottom plate disposed below at least a portion of the conductive ribbon and conductively coupled to the inner electrode portion and the conductive sidewall;
    wherein the conductive sleeve and the conductive ribbon are configured to generate at least one capacitance.

2. The 3D LC circuit of claim 1 wherein the conductive top plate and the conductive bottom plate are insulated from the outer electrode portion.

3. The 3D LC circuit of claim 1 wherein:
    the inductor comprises a linear outer electrode portion; and
    the conductive sleeve comprises a linear sidewall disposed along the linear outer electrode portion.

4. The 3D LC circuit of claim 1 wherein:
    the inductor comprises a curved outer electrode portion; and the conductive sleeve comprises a curved sidewall disposed along the curved outer electrode portion.

5. The 3D LC circuit of claim 1 wherein the at least one capacitance is adjusted by increasing or decreasing a length of the conductive ribbon.

6. The 3D LC circuit of claim 1 wherein a quality factor (Q-factor) of the 3D LC circuit is adjusted by increasing or decreasing the defined height of the conductive ribbon.

7. The 3D LC circuit of claim 1 configured to distribute an induced electrical current across the defined height of the conductive ribbon.

8. The 3D LC circuit of claim 1 wherein the defined height of the conductive ribbon is greater than or equal to two hundred micrometers.

9. The 3D LC circuit of claim 1 wherein the winding portion comprises at least one outer section disposed along the inner electrode portion, wherein the inner electrode portion is between the at least one outer section and the outer electrode portion.

10. The 3D LC circuit of claim 9 wherein:
the winding portion further comprises at least one inner section disposed between the inner electrode portion and the outer electrode portion; and
the conductive sleeve and the conductive ribbon are further configured to:
generate a first capacitance between the inner electrode portion and the at least one inner section;
generate a second capacitance between the at least one inner section and the outer electrode portion; and
generate a third capacitance between the outer electrode portion and the conductive sidewall.

11. The 3D LC circuit of claim 10 wherein:
the conductive sleeve further comprises a second conductive sidewall disposed between the at least one inner section and the outer electrode portion; and
the conductive sleeve and the conductive ribbon are further configured to:
generate the first capacitance between the inner electrode portion and the at least one inner section;
generate the second capacitance between the at least one inner section and the second conductive sidewall and between the second conductive sidewall and the outer electrode portion; and
generate the third capacitance between the outer electrode portion and the conductive sidewall.

12. The 3D LC circuit of claim 9 further comprising a second conductive sleeve, the second conductive sleeve comprising:
a second conductive sidewall disposed along the at least one outer section of the winding portion, wherein the at least one outer section is between the second conductive sidewall and the inner electrode portion;
a second conductive top plate disposed above the conductive ribbon and conductively coupled to the at least one outer section and the second conductive sidewall; and
a second conductive bottom plate disposed below the conductive ribbon and conductively coupled to the at least one outer section and the second conductive sidewall; and
wherein the second conductive sleeve and the conductive ribbon are configured to generate an additional capacitance between the second conductive sidewall and the at least one outer section of the winding portion.

13. The 3D LC circuit of claim 12 wherein:
the winding portion comprises at least one linear outer section; and
the second conductive sleeve comprises a second linear conductive sidewall disposed along the at least one linear outer section.

14. The 3D LC circuit of claim 12 wherein:
the winding portion comprises at least one curved outer section; and
the second conductive sleeve comprises a second curved conductive sidewall disposed along the at least one curved outer section.

15. The 3D IC circuit of claim 1 further comprising:
a top insulation layer disposed between the conductive top plate and the top surface of the substrate to insulate the conductive top plate from the conductive ribbon and the conductive sidewall;
one or more top conductive vias disposed in the top insulation layer to conductively couple the conductive top plate to the inner electrode portion and the conductive sidewall;
a bottom insulation layer disposed between the bottom surface of the substrate and the conductive bottom plate to insulate the conductive bottom plate from the conductive ribbon and the conductive sidewall; and
one or more bottom conductive vias disposed in the bottom insulation layer to conductively couple the conductive bottom plate to the inner electrode portion and the conductive sidewall.

16. A method for improving a quality factor (Q-factor) of a three-dimensional (3D) inductor-capacitor (LC) circuit comprising:
forming an inductor by a conductive ribbon, wherein:
the inductor comprises an inner electrode portion, an outer electrode portion, and a winding portion extending between the inner electrode portion and the outer electrode portion; and
the conductive ribbon comprises opposing sidewalls having a defined height that equals at least twice a thickness of the conductive ribbon and is provided in a substrate with the opposing sidewalls being perpendicular to a top surface and a bottom surface of the substrate;
providing a conductive sleeve, comprising:
disposing a conductive sidewall along the outer electrode portion, wherein the outer electrode portion is between the conductive sidewall and the inner electrode portion;
disposing a conductive top plate above at least a portion of the conductive ribbon and conductively coupled to the inner electrode portion and the conductive sidewall; and
disposing a conductive bottom plate disposed below at least a portion of the conductive ribbon and conductively coupled to the inner electrode portion and the conductive sidewall; and
generating at least one capacitance by the conductive sleeve and the conductive ribbon.

17. The method of claim 16 further comprising insulating the conductive top plate and the conductive bottom plate from the outer electrode portion.

18. The method of claim 16 further comprising adjusting the at least one capacitance by increasing or decreasing a length of the conductive ribbon.

19. The method of claim 16 further comprising adjusting the Q-factor of the 3D LC circuit by increasing or decreasing the defined height of the conductive ribbon.

20. The method of claim 16 further comprising distributing an induced electrical current across the defined height of the conductive ribbon.

* * * * *